(12) United States Patent
Field (10) Patent No.: US 9,330,643 B2
(45) Date of Patent: May 3, 2016

(54) HI-HAT FOR ELECTRONIC CYMBAL ASSEMBLY

(71) Applicant: Field Electronic Drums, LLC, Longwood, FL (US)

(72) Inventor: William Todd Field, Longwood, FL (US)

( * ) Notice: Subject to any disclaimer, the term of this patent is extended or adjusted under 35 U.S.C. 154(b) by 0 days.

(21) Appl. No.: 14/612,821

(22) Filed: Feb. 3, 2015

(65) Prior Publication Data

US 2015/0143979 A1   May 28, 2015

Related U.S. Application Data

(63) Continuation of application No. 13/287,760, filed on Nov. 2, 2011, now Pat. No. 8,946,536.

(60) Provisional application No. 61/414,192, filed on Nov. 16, 2010.

(51) Int. Cl.
  G10H 3/00    (2006.01)
  G10D 13/06   (2006.01)
  G10H 3/14    (2006.01)
  G10D 13/00   (2006.01)

(52) U.S. Cl.
  CPC ............ G10D 13/065 (2013.01); G10D 13/006 (2013.01); G10H 3/00 (2013.01); G10H 3/146 (2013.01); *G10H 2220/525* (2013.01); *G10H 2230/321* (2013.01)

(58) Field of Classification Search
  CPC ............ G10H 3/146; G10H 2230/271; G10H 2230/331; G10H 2230/321
  See application file for complete search history.

(56) References Cited

U.S. PATENT DOCUMENTS

| | | | |
|---|---|---|---|
| 5,965,834 A | 10/1999 | Suenaga et al. | |
| 6,815,602 B2 | 11/2004 | De Franco | |
| 6,822,148 B2 | 11/2004 | Yanase | |
| 6,881,885 B2 | 4/2005 | Yoshino et al. | |
| 7,943,841 B2 | 5/2011 | Toda | |
| 8,946,536 B2 | 2/2015 | Field | |
| 9,053,693 B1 * | 6/2015 | Wei ........................... | G10H 3/00 |
| 2004/0016339 A1 | 1/2004 | Yoshino et al. | |
| 2004/0060427 A1 | 4/2004 | Franco | |
| 2005/0039593 A1 * | 2/2005 | Wachter ................. | G10H 3/146 84/730 |
| 2005/0145101 A1 * | 7/2005 | Yoshino ................... | G10H 1/32 84/723 |
| 2006/0096448 A1 * | 5/2006 | Yoshino ................... | G10H 1/34 84/734 |
| 2006/0156910 A1 * | 7/2006 | Yoshino ................... | G10H 1/34 84/723 |
| 2009/0139387 A1 | 6/2009 | Toda | |
| 2012/0048099 A1 * | 3/2012 | Wissmuller ............ | G10H 1/348 84/723 |
| 2012/0118130 A1 * | 5/2012 | Field ...................... | G10H 3/146 84/730 |
| 2013/0047826 A1 * | 2/2013 | Wissmuller ............. | G10H 3/00 84/723 |

* cited by examiner

*Primary Examiner* — Marlon Fletcher
(74) *Attorney, Agent, or Firm* — Angela Holt; Bradley Arant Boult Cummings LLP (57) ABSTRACT

The present invention includes an electronic cymbal assembly including a hi-hat clutch for mounting a hi-hat to a hi-hat stand post; a top cymbal; a self dampening trigger system attached to the underside of the top cymbal; a bottom cymbal; an input jack box mounted to the underside of the bottom cymbal; and a hi-hat cymbal mounting post. The cymbal assembly may be mounted using a magnetic ring configuration or a threaded pole configuration.

17 Claims, 11 Drawing Sheets

ALTERNATE SHAPE 1

- 301 Top of Choke
- 303 Adhesive gasket
- 304 Bottom of Choke
- 305 Bottom Rubber Choke Gasket

ALTERNATE SHAPE 2

ALTERNATE SHAPE 3

HI-HAT FOR ELECTRONIC CYMBAL ASSEMBLY

CROSS REFERENCE TO RELATED APPLICATIONS

This application is a continuation of and claims the benefit of U.S. Non-Provisional application Ser. No. 13/287,760 titled "Electronic Cymbal Assembly with Modular Self-Dampening Triggering System," filed on Nov. 2, 2011, which claims the benefit of U.S. Provisional Application No. 61/414,192 filed on Nov. 16, 2010, the disclosures of which are hereby incorporated herein by reference in their entirety.

FIELD OF THE INVENTION

This invention relates to electronic cymbals. Specifically, the invention relates to a modular self-dampening triggering system in an electronic cymbal assembly.

BACKGROUND OF THE INVENTION

Conventional acoustic cymbals have an edge portion which is an outer peripheral edge portion, a bow portion which is an intermediate portion and a convex cup portion which is a central portion. If an edge portion of the acoustic cymbal is struck with a percussion member such as a stick the strike produces, a tone called a crash tone having a noise component. This tone is used to put emphasis in a musical performance. Also, striking the bow portion produces legato tone or ride tone. Further, striking the cup portion produces a bell tone having many treble components. In this way, different tones can be obtained from striking the edge portion, the bow portion and the cup portion of the acoustic cymbal, respectively. It is, therefore, possible to expand a performance presentation by striking the edge portion, the bow portion and the cup portion separately.

In recent years, an electronic cymbal imitating the acoustic cymbals has been widely used. An electronic cymbal detects the striking position and the striking force of a stick or the like by means of a striking sensor, controls a sound source based on the detected striking position and striking force, and thereby produces a cymbal sound (electronic percussion sound). The electronic cymbal can, therefore, advantageously lower the volume of the striking sound. As the electronic cymbal of this type, there are proposed electronic cymbals made of hard resin such as ABS and enabling a striking sound for which volume is to be lowered, produced from the electronic cymbal itself and an electronic cymbal made by combining two disk-shaped frames having different sizes so as to enhance a sense of performance and a performance quality. In addition, there are other electronic cymbals having a bonded cushion material and having a striking sensor attached to the surface of a disk-shaped metallic cymbal.

The electronic cymbals in the prior art, which are formed out of hard resin, disadvantageously have a problem in that the striking sensation is different from that of an acoustic cymbal. The electronic cymbal made by a combination of two disk-shaped frames is also visually unappealing. Also, for electronic cymbals in the prior art it is disadvantageously difficult to detect a striking force with high accuracy.

Thus, there is a need in the art for an electronic cymbal arrangement that more closely resembles the performance obtained through use of an acoustic cymbal.

SUMMARY AND OBJECTS OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention solves the issues with prior art systems in terms of replicating or producing a sound similar to an acoustic cymbal. In one embodiment of the present invention, two piezo sensors work in conjunction across the diameter of the striking surface of the cymbal to produce a highly accurate conversion of acoustic energy into electrical energy. The present invention relies on the positioning of the two piezo sensors across the surface diameter of the cymbal and on a combination of transducer signals that generate a digital representation of the source acoustic energy. The combination of these signals, results in the transmission of acoustic energy in a manner that is unique and decidedly more accurate than any known prior art system.

In one embodiment of the invention, a series of nuts and bolts secure a self-dampening triggering system to the cymbal. The size, molecular attributes, and location of these nuts and bolts optimize the balance and control of acoustic energy throughout the striking surface.

In one embodiment, the present invention includes hi-hat technology that incorporates a neodymium magnetic that attaches to a variable resistor and can be controlled with traditional hi-hat foot pedals. The same modular self-dampening technology discussed above is utilized with the hi-hat. In one embodiment the hi-hat cymbals break away and can be removed easily and replaced by an acoustic high-hat with no modification to the stand. The present invention also allows for the use of a "drop clutch" mechanism typically only possible with acoustic hi-hats.

In one embodiment, the electronic cymbals of the present invention utilize a modular self-dampening triggering system that covers only 50% of the surface area on the cymbal's underbody. Advantages of the present invention include the following:

a. Preventing the cymbal from rotating away from the user without the need for additional components that may reduce the "feel" of natural acoustic cymbals;

b. Optimizing the reduction of vibrations that cause "false triggering" while preserving the natural characteristics of a metal cymbal being struck. (i.e., the attack/feel of a metal cymbal being struck, the swing of the cymbal, the weight of the cymbal);

c. Dampening the audible noise level without the need for additional materials, processes, or components that would ultimately reduce the aesthetics or functionality of a natural acoustic cymbal;

d. Allowing the self-dampening triggering system to be mounted on a wide range of flat, convex, or concave surfaces with minimal functional degradation; and e. Allowing for easy repair in the event of a malfunction or defect.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF ILLUSTRATIVE EMBODIMENTS

In one embodiment, the electronic cymbal of the present invention includes an underside and a top portion, which may be made of bronze. The invention includes a trigger system that uses half of the surface area of the cymbal and is attached by nuts and bolts. This trigger system requires no adhesive or laminating, unlike other prior art electronic cymbals, and is completely removable and modular. The triggering system also includes a rubber gasket which is mounted underneath the top metal cover of the electronic cymbal to form a modular trigger system.

In one embodiment piezo sensors are attached onto the top metal gasket plate. The cymbal unit is self-contained, including the plug system. Thus, the combination of the rubber gasket and the sensors, once unbolted, can be put onto, say for example, a trashcan lid or piece of wood or any surface imaginable. The rubber gasket is also flexible so it conforms to different surfaces. It may be made out of a neoprene rubber and it dampens any surface that it is applied to, avoiding false triggering and applying the right amount of dampening so that when it is triggered, the strike will be accurate and will not constantly resonate.

The present invention also includes a choke system to stop the triggering. The choke acts basically as an on and off switch. An adhesive may be placed between the choke and the cymbal. The adhesive may be similar to the type used for aircraft wings and its thickness may be less than a millimeter. When one hits the choke it will trigger a sound that is sent to the brain of the sound module, so that a computer associated with the sound module will basically tell the sound system to shut off. In the present invention the choke may be completely made of galvanized metal (e.g., 26 gauge galvanized steel) and it may be built by using two separate pieces of metal bonded together and just enough so that contact is not made, acting essentially as an on and off switch. In a preferred embodiment, the rubber gasket is of a thickness of approximately ⅛ inches for effective dampening. Thinner embodiments may cause the triggering system to stop the vibration through the metal.

Another feature of the present invention relates to the placement of the bolts such that when the rubber gasket is attached to the outer edge and when a stick strikes the surface of the cymbal, the vibration transfers right through the screws. The screw may be placed right next to the piezo sensor, resulting in a much more accurate trigger response. When the cymbal is struck far out in relation to where the piezo sensor is, energy is transferred through the bolt to the piezo sensor and the energy is picked up by the sensor. Two outer edges may be wired in together in a circuit, so the two act together, producing a much wider range of triggering using piezo sensors instead of what other prior art systems use, such as a film switch. In the present invention the choke is essentially a true on and off choke, with piezo sensors being placed separately, which constitutes an assembly difference from prior art systems that use a strip to act as both.

Unlike an electronic drum trigger or a guitar trigger that is applied to an acoustic instrument, the present invention includes a self-dampening system that, regardless of the surface it is put on, dampens that surface and eliminates the vibrations to obtain an accurate triggering response.

In accordance with one embodiment of the present invention, the trigger system has a wide surface and once it is screwed down, and the placement of these screws is placed on the outer edge, the outer edge will trigger accurately. The design of the present invention allows better separation of the piezo sensors due to this dampening, and thus the cross-triggering is greatly reduced as a result of the use of the rubber gasket and the position of the screws. The modular triggering device can be attached onto any material that the user would want to turn into a trigger, into an electronic device.

The hi-hat of the present invention may include an internal control device, for example, a variable resistor controller, to control the different resistance points which send a signal out to the sound module. Once the hi-hat is completely closed all the way there are different stages of opening and closing.

The variable resistors may include a switch inside. The switch moves up and down based on movement of the pedal. The up and down movement is what guides the trigger.

The variable resistor of the present invention uses a neodymium magnet to attach the plunger system. The up and down motion, is completely controlled by the hi-hat stand. Any hi-hat stand on the market can be used with the present invention, and every high hat stand has a spring built into the stand. In a preferred embodiment, the variable resistor does not require a spring.

More specifically regarding the hi-hat assembly of the present invention, the present invention may use a standard hi-hat clutch used for mounting the hi-hat to the hi-hat stand post. A portion of the hi-hat clutch may be inserted through a hi-hat dutch top of the top adjustment nut to affix a number of components to a hi-hat cymbal post. These components may include, a hi-hat clutch bottom of the top adjustment nut; a hi-hat clutch top felt washer; a top cymbal, made from metal or any other material; a self dampening trigger system, mounted to the underside of cymbal; a rubber washer used between the cymbal and a magnet; a high strength neodymium ring magnet, magnetically attached to an inner sliding sleeve tube, and acting as a magnetic attachment to the top hi-hat and inner sleeve tube to pull the tube up and down when the hi-hat stand pedal is pressed and released in up and down motion (it also acts as a breakaway detachable top hat that can be pulled apart and away from the inner sleeve tube); a large circular mounting plate, which may be made from steel that, when touching the ring magnet is magnetically charged and acts as a larger base mounting plate for the inner sliding sleeve; a clutch felt washer; a bottom clutch mounting nut, for holding the magnet and all washers to the top hi-hat cymbal; an inner sliding sleeve tube of steel material that can be magnetically attached to the neodymium ring magnet, and having a center hole that the sliding variable resistor arm post goes through (the hole being used for holding the arm of the variable resistor for the up and down position of the variable resistor that in turn tells the sound module what sound should be triggered when striking the main trigger system); an outer aluminum mounting tube, made of non magnetic aluminum material, the tube staying stationary and mounted to the bottom cymbal and having a vertical channel cut through it so that a variable resistor sliding arm can slide up and down; and a bottom hi-hat, with the mounting tube being mounted to this bottom hi-hat and all electrical and input mounting boxes mounted to the bottom cymbal. The hi-hat assembly further includes the variable resistor which is mounted to the non-magnetic tube and is used to connect to the input jack positive and negative connections. This variable resistor is used to send variable resistance messages to the sound module that produces the different up and down triggered sounds that is interpreted by the sound module. There is also an electrical wire connection from the variable resistor to the input mounting box through the underside of bottom hi-hat cymbal. Another electrical wire connection is used to connect the main trigger system to the input jack box mounted on underside of bottom hi-hat cymbal, with a stereo jack connecting to an input jack mounted on top of the cymbal that passes through to the underside mounted input jack box (this is the connection of the top cymbal triggers). The assembly also includes the input jack box, mounted to the underside of the cymbal, and housing the electrical connection of the stereo wire connection used for the connection to the sound module (this is the main input connection box to the external sound module). Finally, the assembly includes a hi-hat cymbal mounting post, used to provide a mounting surface for the hi-hat clutch to mount the top cymbal for the open and close position relative to the up and down position of the foot pedal on the hi-hat stand.

Figure 1:
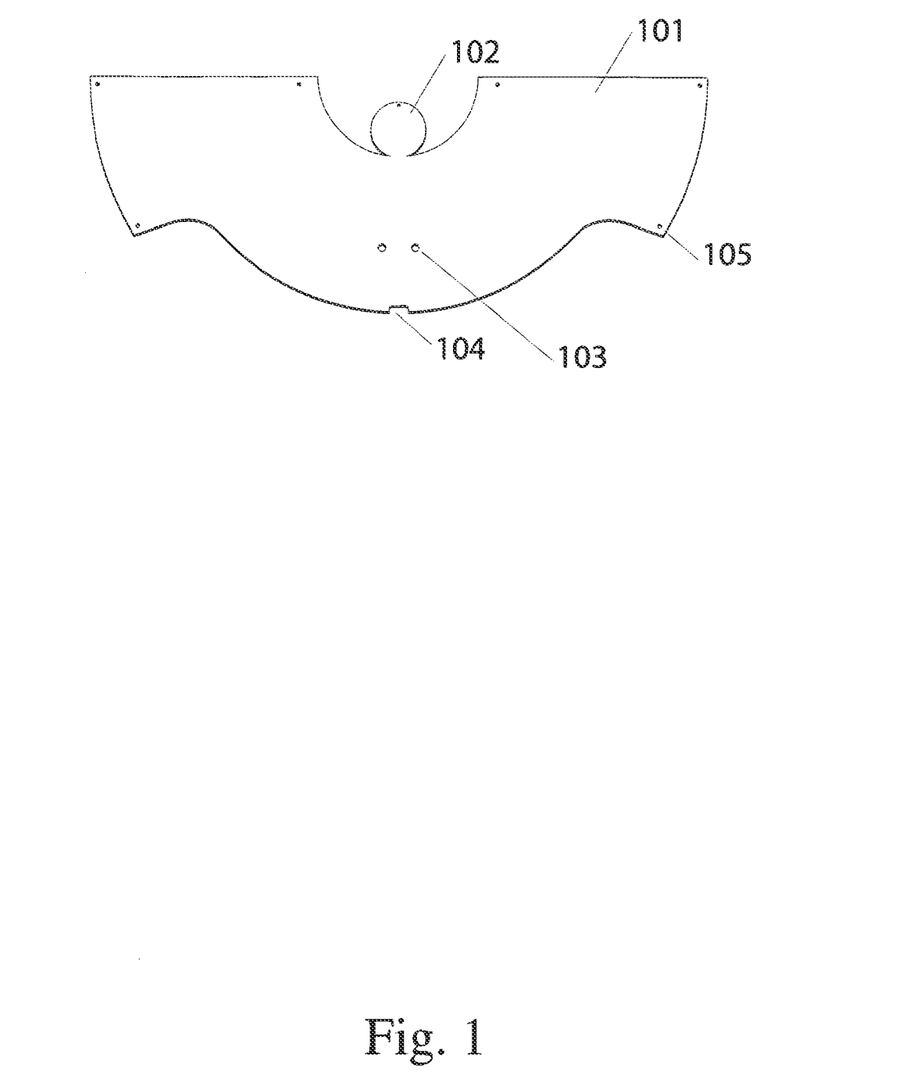
FIG. 1 illustrates a trigger system top cover in accordance with one embodiment.

With specific reference to the figures, FIG. 1 illustrates a trigger system top metal cover in accordance with one embodiment of the present invention. The top metal cover plate 101 mounts on top of a rubber gasket and bolts to any surface. Piezo sensors are attached to the under-side with adhesive. The cover plate also acts a resonance transfer plate. When the top metal cover 101 is struck, the vibration transfers to the piezo sensors.

The circular portion piezo sensor cover 102 covers the sensor and acts as a resonance plate. It may be used to mount the bell trigger piezo sensor when used for electronic cymbals.

The input jack and wire pass through holes 103 to allow wire connections to pass from the underside to the top and then connect to the input jacks to the main connection to the input device/sound module. The notch out area 104 the choke system included positive and negative connections that may allow mounting of the choke connection tabs without making contact to the metal cover plate.

Mounting holes 105 may be used for mounting the trigger system to a cymbal or any other surface being applied to. The mounting holes 105 transfer the vibration to the metal plate, thus transferring the vibrations to the piezo sensors which trigger the input device/sound module. Hole positions are close to the piezo sensor for optimum transfer of vibration and trigger response.

Figure 2:
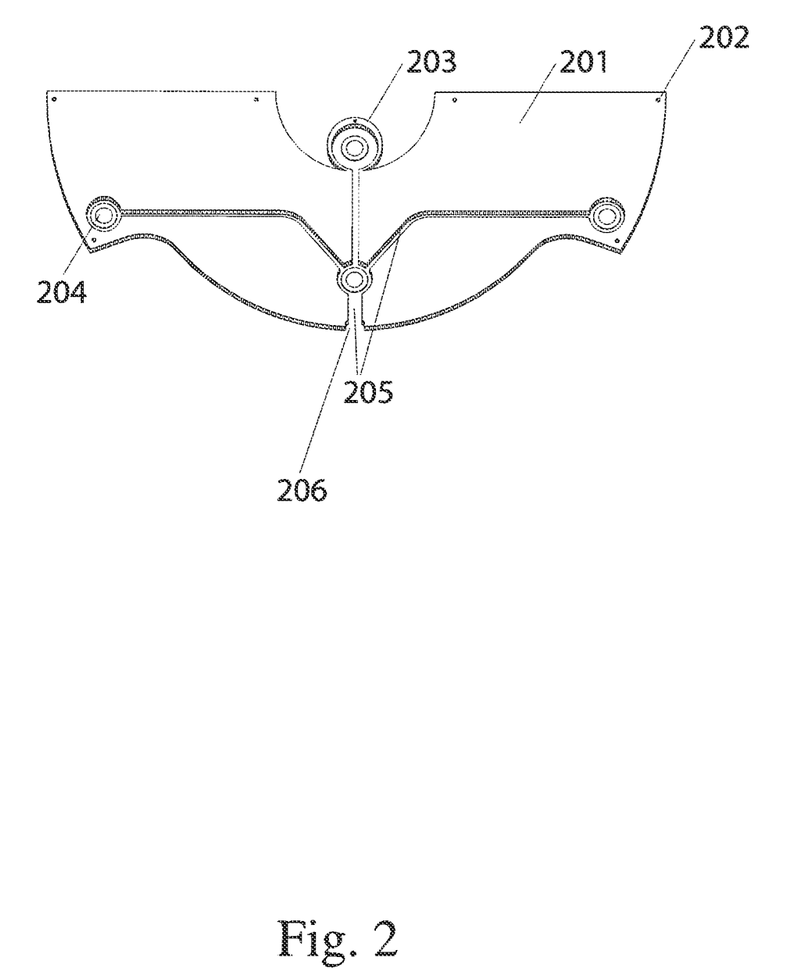
FIG. 2 illustrates a trigger system rubber gasket in accordance with one embodiment.

FIG. 2 illustrates a trigger system rubber gasket. Rubber gasket 201 mounts underneath the top metal cover. The piezo sensor mounts to the top metal gasket. The rubber dampens any surface it is applied to, making the piezo sensor more accurate and eliminating unwanted excessive fake trigger vibrations.

Mounting holes 202 may be used for mounting the trigger system rubber gasket to a cymbal or any other surface being applied to. The mounting holes transfer the vibration to the metal plate, thus transferring the vibrations to the piezo sensors which trigger the input device/sound module. Hole positions are close to the piezo sensor for optimum transfer of vibration and trigger response.

A circular rubber dampening ring 203 surrounds the sensor and acts as a vibration dampener. It may be used to mount the bell trigger piezo sensor when used for electronic cymbals.

The piezo sensors 204 mount in the middle of the rubber gasket and adhere to the top metal cover. The wire connection 205 passes through the channel area. The connection 205 allows wires to be push-mounted under the top metal cover and connects the piezo sensors in a circuit.

The notch out 206 may be used for choke positive and negative tabs. It allows for push-mounting of the choke system to the main trigger system without making contact to edges and avoiding any shorting of the circuit.

Figure 3:
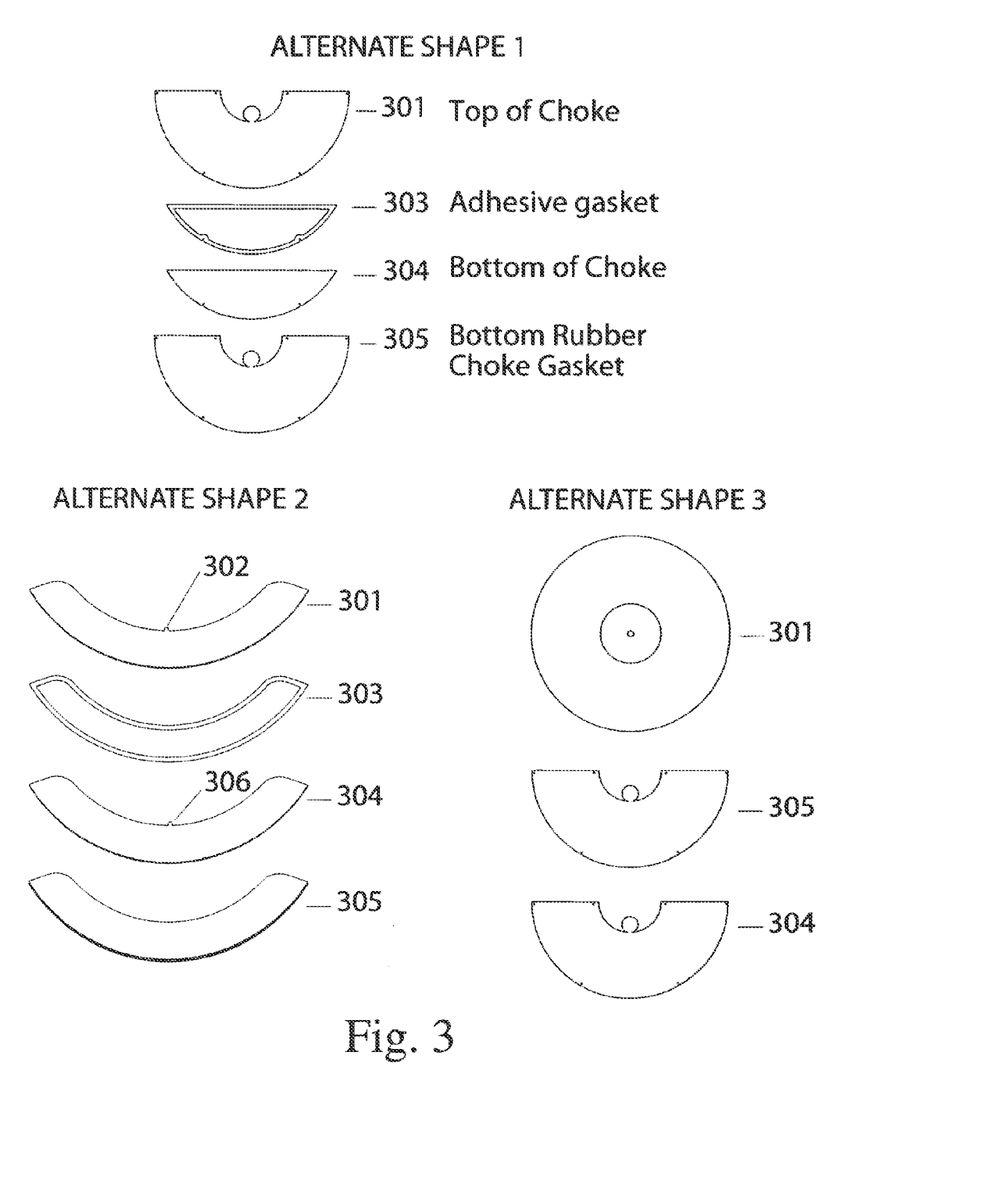
FIG. 3 illustrates a choke system in accordance with one embodiment as well as alternative shapes of the choke system in accordance with alternative embodiments.

FIG. 3 illustrates a choke system and alternate shapes 1 and 2. The top metal choke section 301 may be made from a thin electrically conductive material. The top choke plate can also be used as the entire cymbal body. A positive connection may act as an off switch to choke the piezo that sends a note off message to the sound module. The top choke cover may bend slightly when grabbed to make contact with the bottom choke to short the sensor acting as an off switch. A suitable conductive or capacitive electronic touch switch connects to the tope choke and bottom choke plates. When a human makes contact while touching the suitable conductive or capacitive electronic touch switch, the human contact in turn causes a short and sends a choke/note off signal to the input device/sound module.

FIG. 3 also illustrates a choke positive tab connection 302. The positive wire solders to this tab and connects the circuit to the positive ring of the input stereo jack.

A double sided adhesive 303 in the gasket may be used for bonding the top and bottom metal choke pieces together on the outer edges only, leaving the center portion free to make contact when pressure is applied, and then return to its normal state. The illustrated embodiment allows for a very small gap between the top and bottom metal cover so that minimal pressure can be applied to the top cover and bend to touch and form a choke or note off signal to the input device/sound module.

The bottom metal choke section 304 may be made from an electrically conductive material, such as a very thin sheet steel metal. A negative connection may act as an on and off switch to choke the piezo sensor that sends a note off message to the sound module. The bottom metal choke section makes contact with the top metal choke and shorts the sensor acting as an off switch. This plate is also connected to the suitable conductive or capacitive electronic touch switch. When a human makes contact while touching the conductive or capacitive electronic touch switch this in turn causes a short and sends a choke/note off signal to the input device or sound module.

The bottom rubber gasket 305 may be used for mounting the entire choke system and acts to dampen vibrations. The gasket may be of the same material and thickness as the trigger system gasket.

The illustrated embodiment also includes a choke negative tab connection 306. The negative wire solders to this tab and connects the circuit to the negative ground of the input stereo jack.

FIG. 3 also illustrates two alternative shapes of the choke system: alternative shape 1 and alternative shape 2.

Figure 4A:
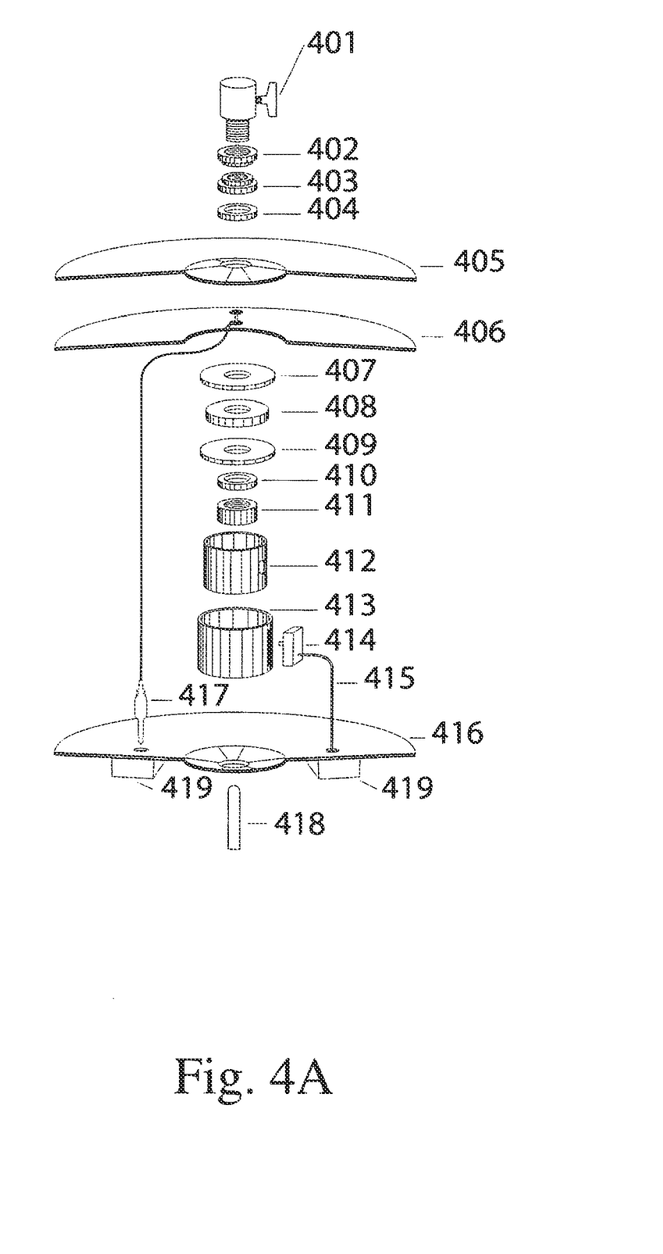
FIG. 4A illustrates the components of a hi-hat controller in accordance with one embodiment.

FIG. 4A illustrates the components of the magnetic hi-hat controller in accordance with one embodiment of the present invention. A standard hi-hat clutch 401 may be used for mounting the hi-hat to the hi-hat stand post. Additional components of the hi-hat controller assembly include a hi-hat clutch top 402 of the top adjustment nut; a hi-hat clutch bottom 403 of the top adjustment nut; a hi-hat clutch top felt washer 404; a top cymbal 405, made from metal or any other material; a self dampening trigger system 406, which may mount to the underside of the cymbal; and a rubber washer 407 used between the cymbal and a high strength neodymium ring magnet 408. The magnet 408 may magnetically attach to the inner sliding sleeve tube. It acts as a magnetic attachment to the top hi-hat and inner sleeve tube to pull the tube up and down when the hi-hat stand pedal is pressed and released in an up and down motion. The magnet also acts as a breakaway detachable top hat that can be pulled apart and away from the inner sleeve tube.

The large circular mounting plate 409 is another component of the hi-hat controller. The plate may be made from steel such that, when touching the ring magnet, is magnetically charged and acts as a larger base mounting plate for the inner sliding sleeve.

A clutch felt washer 410 is positioned between the plate 409 and the bottom clutch mounting nut 411. The nut 411 holds the magnet and all washers to the top hi-hat cymbal.

The inner sliding sleeve tube 412 may be made of a steel material that can be magnetically attached to the neodymium ring magnet. The tube 412 has a center hole and the sliding variable restore arm post goes through that hole. This hole is used for holding the arm of the variable resistor for the up and down position of the variable resistor 414 that in turn tells the sound module what sound should be triggered when striking the main trigger system.

The outer aluminum mounting tube 413 is made of a non-magnetic aluminum material. The tube 413 stays stationary and is mounted to the bottom cymbal. The variable resistor 414 is mounted to this tube. The tube has a vertical channel cut through the tube and the variable resistor sliding arm can slide up and down through the vertical channel.

The variable resistor 414 may be used to connect to the input jack positive and negative connections. The variable resistor may also be used to send variable resistance messages to the sound module that produces the different up and down triggered sounds that are interpreted by a sound module. The variable resistor uses an electrical wire 415 to connect to the input mounting box 419 mounted to the underside of bottom hi-hat cymbal 416. In one embodiment, all electrical and input mounting boxes are mounted to this bottom hi-hat cymbal 416.

The main trigger system uses an electrical wire 417 to connect to the input jack box 419 mounted on the underside of the bottom hi-hat cymbal. The stereo jack connects to an input jack mounted on top of the cymbal and passes through to the underside mounted input jack box. This electrical wire connection 417 is the connection of the top cymbal trigger.

The hi-hat cymbal mounting post 418 is used to provide a mounting surface for the hi-hat clutch to mount the top cymbal for the open and close position relative to the up and down position of the foot pedal on the hi-hat stand.

The input jack box 419 is mounted to the underside of cymbal 416. This box houses the electrical connection of the stereo wire connection used for the connection to the sound module. This box is the main input connection box to the external sound module.

Figure 4B:
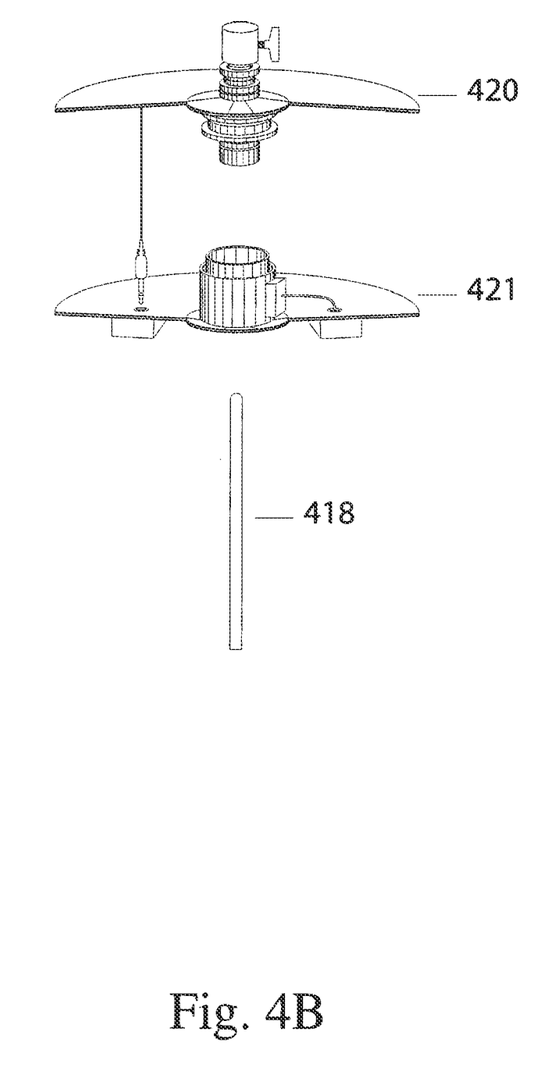
FIG. 4B illustrates an assembled hi-hat controller in accordance with one embodiment.

FIG. 4B illustrates the assembled magnetic hi-hat controller. The figure illustrates the assembled electronic cymbal hi-hat 420 top and the assembled bottom cymbal hi-hat 421. The figure also illustrates the mounting post 418.

Figure 4C:
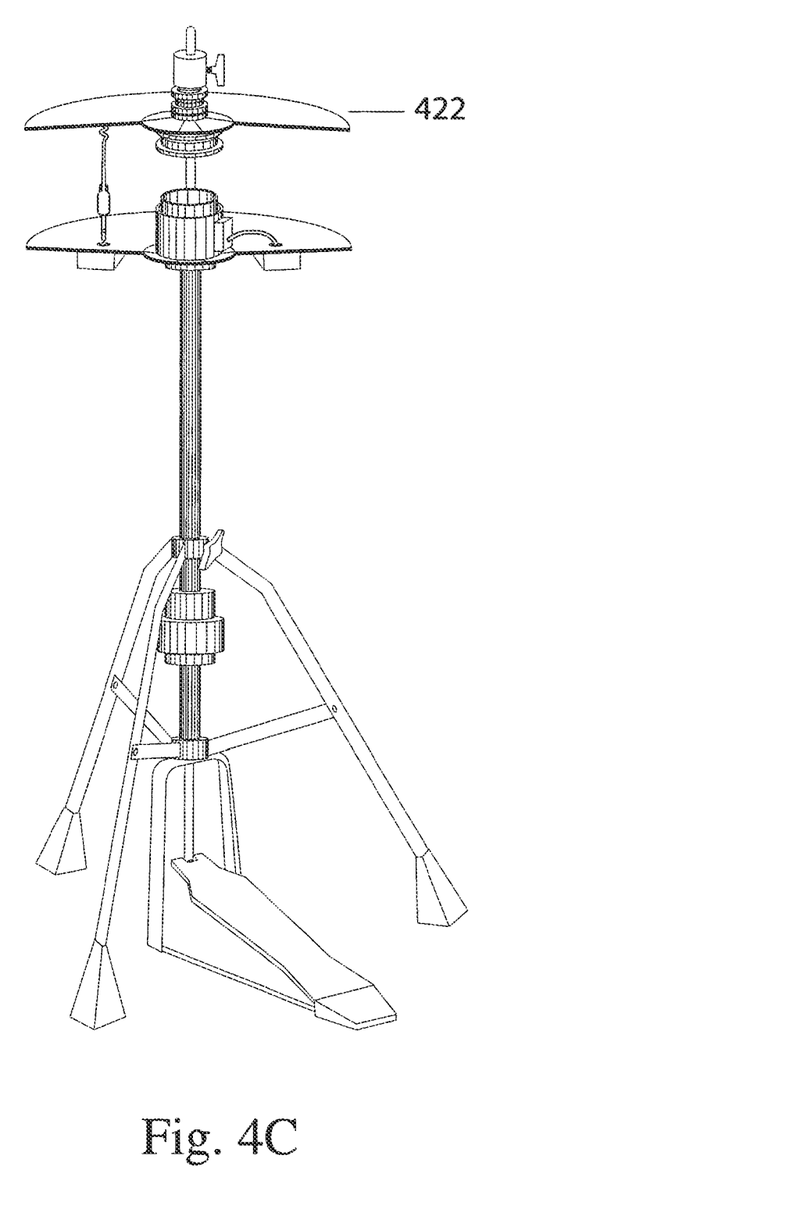
FIG. 4C illustrates an assembled hi-hat controller in accordance with one embodiment.
Figure 4D:
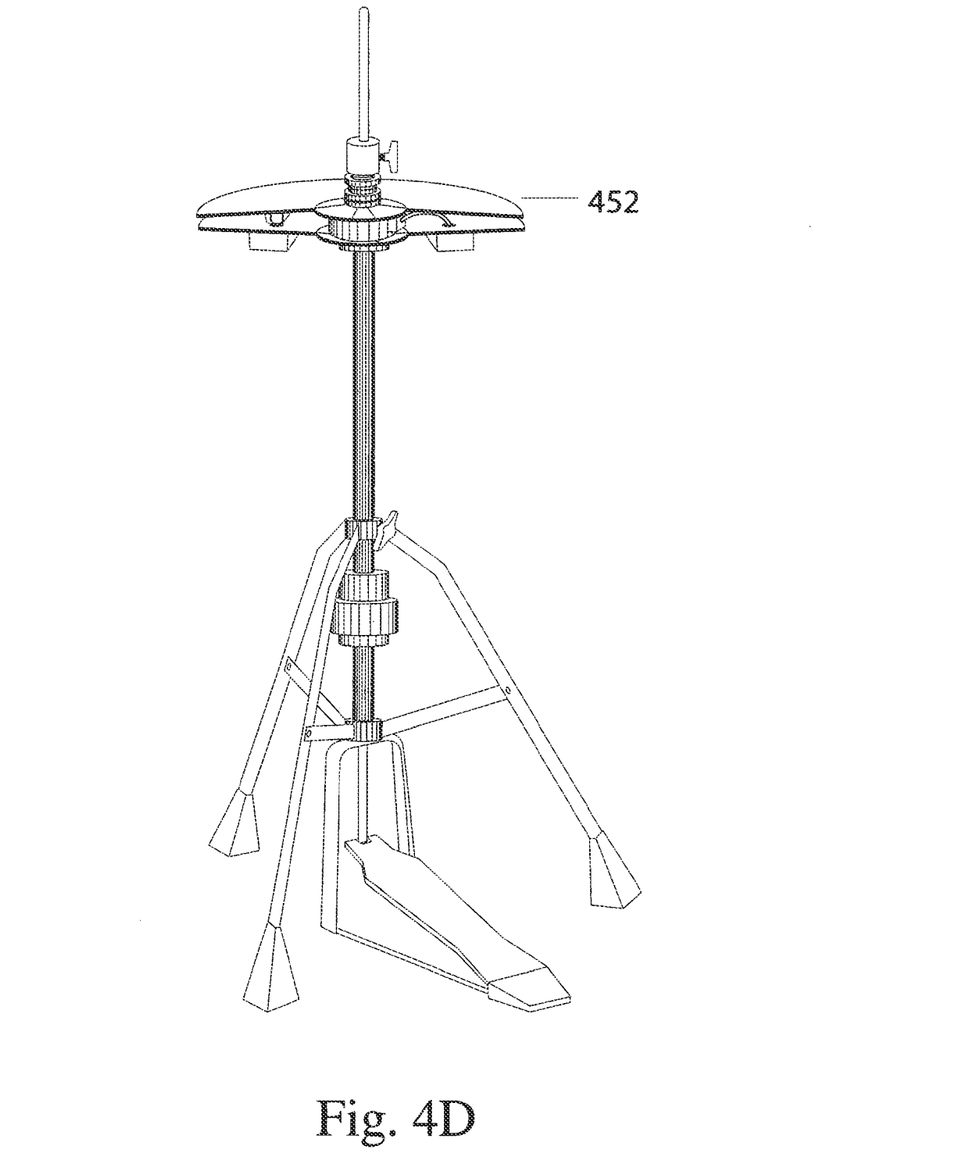
FIG. 4D illustrates an assembled controller in accordance with one embodiment.

FIG. 4C illustrates the assembled hi-hat controller 422 on a hi-hat stand. Using only the spring of the hi-hat stand, an internal spring is used to open and close the hi-hat controller. The internal magnet system magnetically latches the internal slide together to make it possible to have an up and down variable response controller system. This use of the internal high hat spring makes it possible for a drop clutch to be used and for double bass style playing techniques to be used. Using the internal hi-hat spring of a conventional hi-hat also allows for a much more accurate and authentic feeling response for the player or performer. FIG. 4D illustrates the assembled controller of FIG. 4C with the top and bottom cymbals close together (452).

Figure 4E:
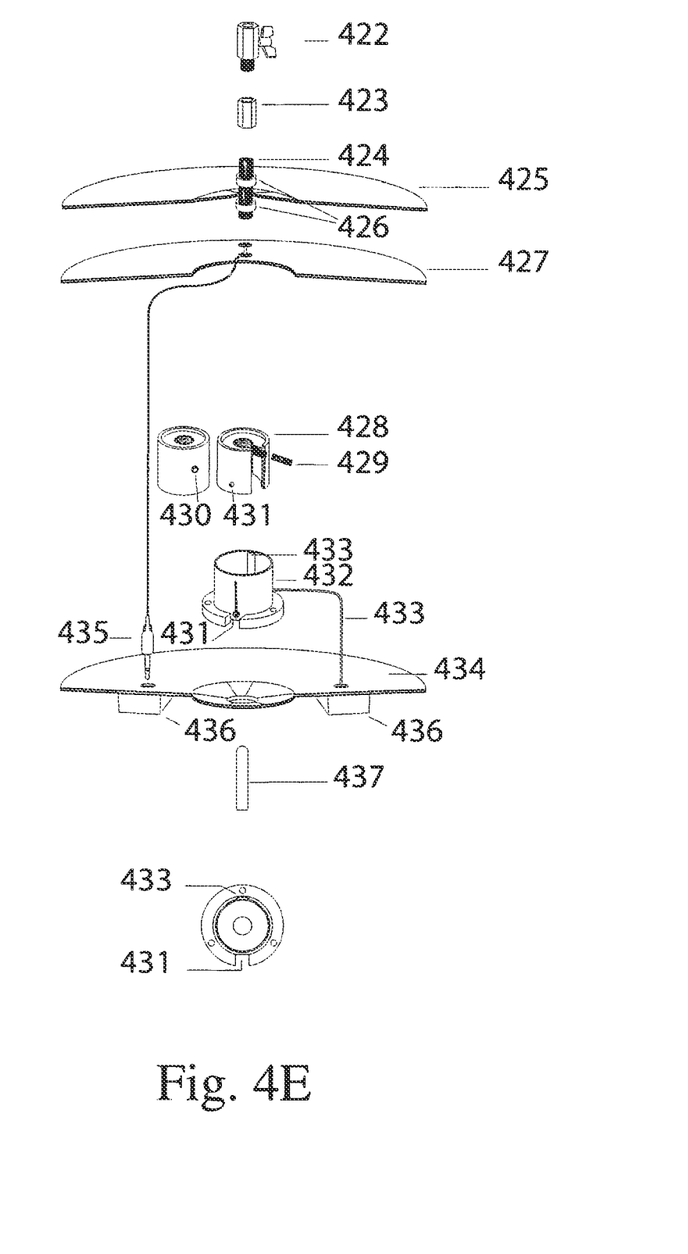
FIG. 4E illustrates an alternative embodiment of the controller of FIG. 4A.

FIG. 4E illustrates an alternative embodiment of the controller of FIG. 4A. A standard hi-hat clutch 422 may be used for mounting the hi-hat to the hi-hat stand post. A hi-hat clutch joining nut 423 joins threaded pole 424 to the hi-hat clutch. The center threaded pole connects to the threaded center sliding sleeve tube. Also illustrated is a top cymbal 425, made from metal or any other material. A self dampening trigger system 427 mounts to the underside of the cymbal 425.

Threaded height adjustment nuts 426 is used to adjust the top cymbal position relative to the center sliding sleeve tube. The inner sliding sleeve tube 428 may be made of a steel material that can be magnetically attached to the neodymium ring magnet. The tube 428 has a center hole and the sliding variable restore arm post goes through that hole. This hole is used for holding the arm of the variable resistor 433. The up and down movement or position of the variable resistor 433 tells the sound module what sound should be triggered when striking the main trigger system. A center threaded pole locking screw 429 may be used to lock the position of the center threaded pole.

Also illustrated is a guide rail 431 for inner sliding a sleeve tube mounted through the outside mounting tube housing base and threaded into inner sliding sleeve tube. An outside mounting tube housing base 432 may be made of non magnetic material. The tube 432 may stay in a stationary position and may be mounted to the bottom cymbal. The variable resistor may be mounted to this tube 432. The tube 432 has a vertical channel cut through the tube that allows the guide rail to slide up and down.

A center spring plunger 430 may be used to make contact with the variable resistor 433. The variable resistor 433 may be used to connect to the input jack positive and negative connections. The variable resistor uses an electrical wire to connect to the input mounting box mounted to the underside of bottom hi-hat cymbal 434. The mounting tube 432 is mounted to the bottom hi-hat 434. All electrical and input mounting boxes may be mounted to this bottom hi hat cymbal.

The electrical wire 435 may be used to connect the main trigger system to the input jack box mounted on the underside of the bottom of the hi-hat cymbal. A stereo jack connects to an input jack mounted on the top cymbal that passes through the to the underside mounted input jack box. This electrical connection 435 is the connection that the top cymbal triggers.

The input jack box 436 is mounted to the underside of cymbal 434. This box houses the electrical connection of the stereo wire connection used for the connection to the sound module. This box is the main input connection box to the external sound module.

The hi-hat cymbal mounting post 437 may be used to provide a mounting surface for the hi-hat clutch to mount the top cymbal for the open and close position relative to the up and down position of the foot pedal on the hi-hat stand.

Figure 4F:
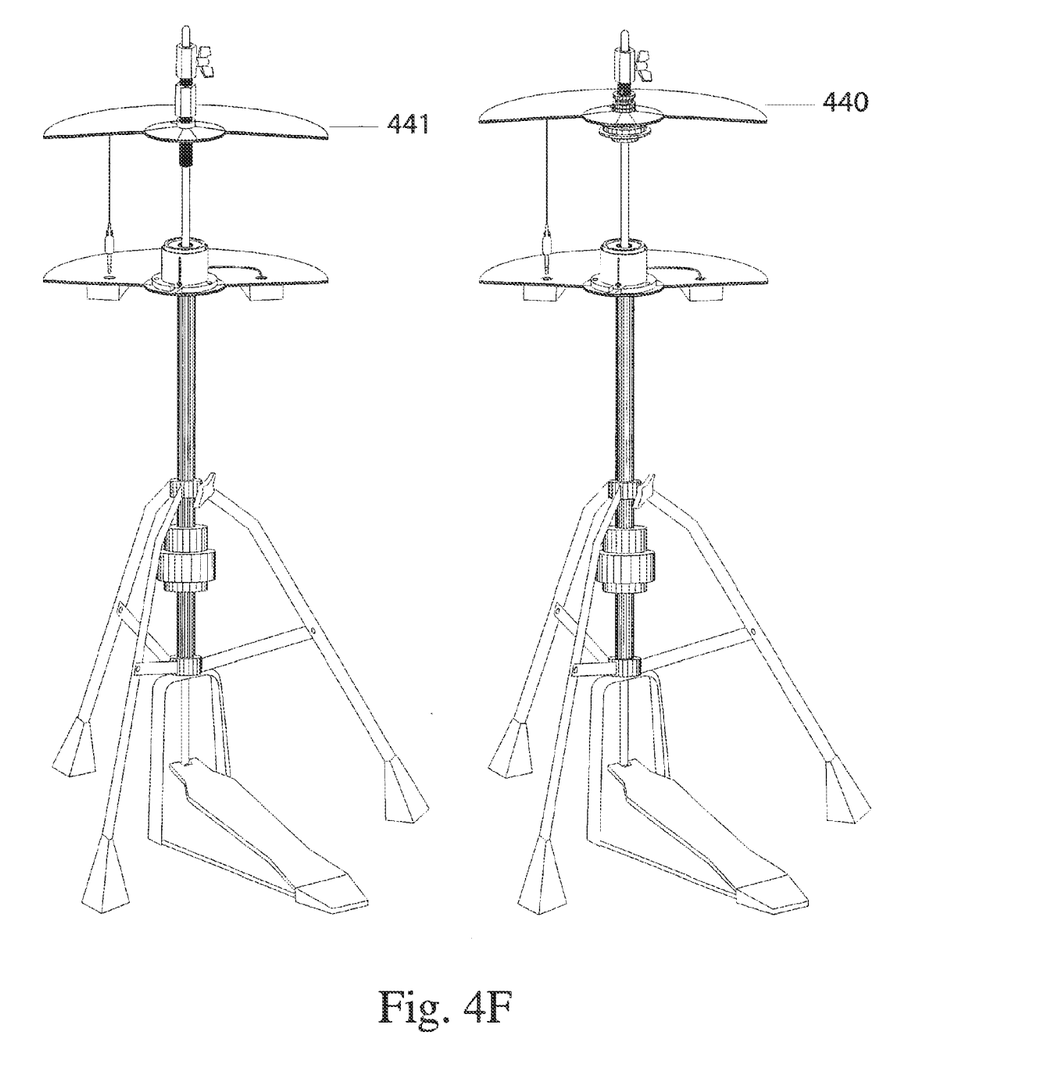
FIG. 4F illustrates an assembled controller in accordance with one embodiment.

FIG. 4F illustrates the assembled hi-hat controller 440 on a hi-hat stand. Using only the spring of the hi-hat stand, an internal spring used to open and close the hi-hat controller. The internal magnet system magnetically latches the internal slide together to make it possible to have an up and down variable response controller system. This use of the internal hi-hat spring makes it possible for a drop clutch to be used with the electronic cymbal and also for double bass style playing techniques to be used. Using the internal hi-hat spring of a conventional hi-hat also allows for a much more accurate and authentic feeling response for the player or performer. FIG. 4F also illustrates an alternate threaded pole mounting 441. The threaded pole mounts through the top cymbal and attaches to the inner sliding tube making it possible for the inner sliding tube to move up and down as the hi-hat pedal is pressed and released.

Figure 4G:
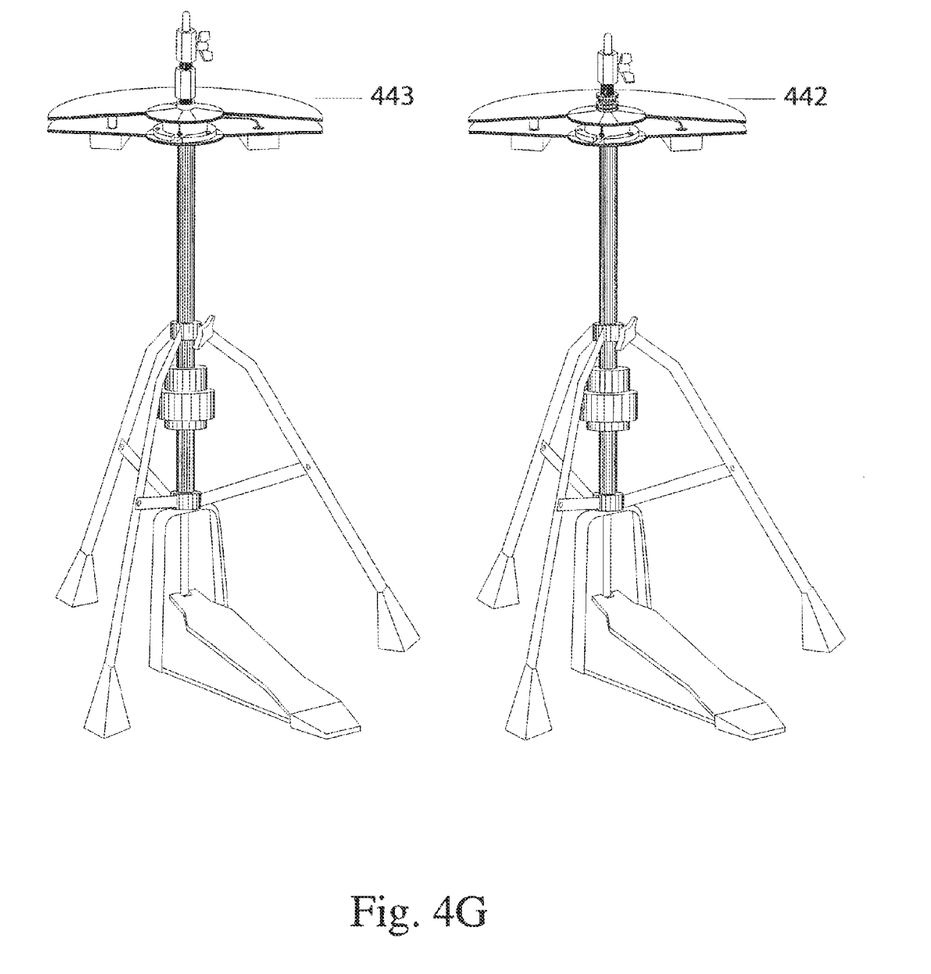
FIG. 4G illustrates an assembled controller in accordance with one embodiment.

FIG. 4G illustrates the assembled controller 440 of FIG. 4C with the top and bottom cymbals closed together (442). FIG. 4G also illustrates a closed view 443 of the assembled electronic cymbal hi-hat 441 system mounted using the alternate threaded pole mounting to the conventional hi-hat stand.

Figure 5:
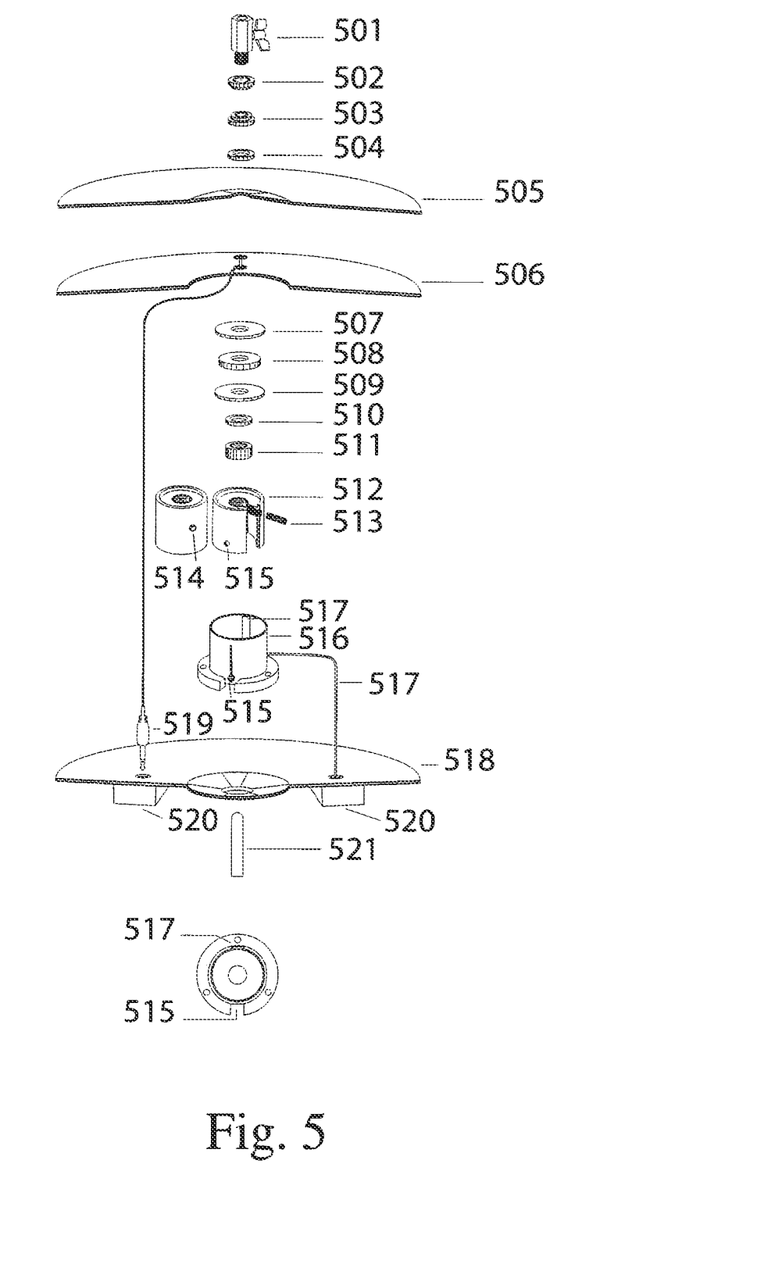
FIG. 5 illustrates a hi-hat controller in accordance with one embodiment.

FIG. 5 illustrates another embodiment of the hi-hat controller of the present invention. A standard hi-hat clutch 501 may be used for mounting the hi-hat to the hi-hat stand post. The controller assembly may be secured through use of a hi-hat clutch top of the top adjustment nut 502; a hi-hat clutch bottom of the top adjustment nut 503; and a hi-hat clutch top felt washer 504.

The controller assembly includes a top cymbal 505 which may be made from metal or any other material. The self dampening trigger system of the present invention mounts to underside of the cymbal 506. A rubber washer 507 may be used between the cymbal and the magnet 508. The high strength neodymium ring magnet 508 magnetically attaches to inner sliding sleeve tube 512. The magnet acts as a magnetic attachment to the top hi-hat and inner sleeve tube to pull the tube up and down when the hi-hat stand pedal is pressed and released in an up and down motion. The magnet also acts as a breakaway detachable top hat that can be pulled apart and away from the inner sleeve tube.

The controller assembly also includes a large circular mounting plate 509, which may be made from steel that, when touching the ring magnet, becomes magnetically charged and acts as a larger base mounting plate for the inner sliding sleeve. The bottom clutch mounting nut 511 holds the magnet and all washers, including clutch felt washer 510, to the top hi-hat cymbal.

The controller assembly also includes an inner sliding sleeve tube 512. The tube may be made of steel and the steel material can be magnetically attached to the neodymium ring magnet. The sleeve tube 512 has a center spring plunger that makes contact with the variable resistor 517. This spring plunger is used to make contact and indicate the up and down position of the variable resistor that in turn tells the input device/sound module what information should be triggered when striking the main trigger system.

A center threaded pole locking screw 513 may be used to lock the position of the center threaded pole. The center spring plunger 514 may be used to make contact with the variable resistor. The controller assembly may also include a guide rail 515 for inner sliding the sleeve tube mounted through the outside mounting tube housing base 516 and threaded into the inner sliding sleeve tube.

The outside mounting tube housing base 516 may be made of non magnetic material. The tube 512 stays stationary and is mounted to the bottom cymbal. The variable resistor is mounted to this tube. The tube has a vertical channel cut through the tube that the guide rail can slide up and down through.

The variable resistor 517 may be used to connect to the input jack positive and negative connections. The resistor may be used to send variable resistance messages to the input device/sound module that produces the different up and down triggered sounds that is interpreted by the input device/sound module. There is an electrical wire connection from the variable resistor to the input mounting box attached to the underside of the bottom hi-hat cymbal.

The controller assembly mounting tube is mounted to a bottom hi-hat 518. All electrical and input mounting boxes are mounted to this bottom cymbal 518.

An electrical wire connection 519 may be used for connecting the main trigger system to input jack box mounted on underside of bottom hi-hat cymbal. A stereo jack connects to an input jack mounted on top of cymbal that passes thru to the underside mounted input jack box 520. This is the connection that the top cymbal triggers.

The input jack box 520 may be mounted to the underside of cymbal 518. This houses the electrical connection of the stereo wire connection used for the connection to the input device/sound module. This is the main input connection box to the external input device/sound module.

The hi-hat cymbal mounting post 521 may be used to provide a mounting surface for the hi-hat clutch to mount the top cymbal for the open and close position relative to the up and down position of the foot pedal on the hi-hat stand.

The present invention is also unique in that it allows a drop clutch feature. The use of the internal hi-hat spring makes it possible for a drop clutch to be used and for double bass style playing techniques to be used. Using the internal hi-hat spring of a conventional hi-hat also allows for a much more accurate and authentic feeling response for the player/performer.

The foregoing description of possible implementations consistent with the present invention does not represent a comprehensive list of all such implementations or all variations of the implementations described. The description of only some implementation should not be construed as an intent to exclude other implementations. Artisans will understand how to implement the invention in many other ways, using equivalents and alternatives that do not depart from the scope of the invention. Moreover, unless indicated to the contrary in the preceding description, none of the components described in the implementations are essential to the invention.

What is claimed is:

1. An electronic cymbal assembly comprising:
  a hi-hat cymbal mounting post;
  a top cymbal received by the mounting post;
  a hi-hat clutch received by the ounting post for coupling the top cymbal to the mounting post;
  a bottom cymbal received by the mounting post;
  an outer mounting tube rigidly affixed to a top side of the bottom cymbal, the outer mounting tube comprising a substantially hollow sleeve, the outer mounting tube further comprising a variable resistor rigidly mounted to the substantially hollow sleeve;
  an inner sliding sleeve tube received by the mounting post, the inner sliding sleeve tube disposed between top cymbal and the bottom cymbal, the inner sliding sleeve tube configured to be received by and to slide up and down within the outer mounting tube;
  the variable resistor coupled to the inner sliding sleeve tube such that when the inner sliding sleeve tube moves upwardly or downwardly with respect to the outer mounting tube, the sliding of the inner sliding sleeve tube with respect to the variable resistor causes the variable resistor to send electronic messages to a sound module to trigger production of sounds.

2. The assembly of claim 1, further comprising a ring magnet received by the mounting post, the ring magnet disposed between the top cymbal and the bottom cymbal, the ring magnet magnetically coupled to the top cymbal, the inner sliding sleeve tube disposed between the ring magnet and the bottom cymbal, the inner sliding sleeve tube magnetically coupled to the ring magnet.

3. The assembly of claim 2, wherein the ring magnet is a neodymium magnet.

4. The assembly of claim 1, further comprising an input jack box mounted to the underside of the bottom cymbal, the input jack box housing electrical connections for coupling to an external sound module.

5. The assembly of claim 4, wherein the variable resistor connects to positive and negative connections of the input jack box.

6. The assembly of claim 2, further comprising a self dampening trigger system attached to the underside of the top cymbal.

7. The assembly of claim 2, the variable resistor mounted to an outer surface of the outer mounting tube.

8. The assembly of claim 7, the outer mounting tube further comprising a vertical channel, the variable resistor comprising a moveable sliding arm, the moveable sliding arm extending through the vertical channel.

9. The assembly of claim 8, the inner sliding sleeve tube further comprising an opening for receiving and retaining the moveable sliding arm such that the moveable sliding arm is moveable up and down to track up and down movement of the inner sliding sleeve tube.

10. The assembly of claim 2, the variable resistor mounted to an inner surface of the outer mounting tube.

11. The assembly of claim 10, the inner sliding sleeve tube further comprising a guiderail extending from an outer surface of the inner sliding sleeve tube.

12. The assembly of claim 11, the outer mounting tube further comprising a vertical slot for receiving the guiderail, such that the guiderail slides upwardly and downwardly within the vertical slot.

13. The assembly of claim 12, the inner sliding sleeve tube further comprising a center spring plunger, the center spring plunger extending outwardly from the inner sliding sleeve tube, the center spring plunger aligned with the variable resistor and configured to contact the variable resistor.

14. An electronic cymbal assembly comprising:
a mounting post;
a foot pedal coupled to the mounting post such that when the foot pedal is depressed, the mounting post moves upwardly, and when the foot pedal is released, the mounting post moves downwardly;
a top striking plate received by the mounting post, the top striking plate affixed to the mounting post such that the top striking plate moves upwardly and downwardly in conjunction with the mounting post;
an outer mounting tube received by the mounting post, the outer mounting tube configured to remain stationary when the mounting post moves upwardly and downwardly, the outer mounting tube comprising a substantially hollow sleeve, the outer mounting tube further comprising a sensor rigidly mounted to the substantially hollow sleeve;
an inner sliding sleeve tube received by the mounting post beneath the top striking plate, the inner sliding sleeve tube configured to move in conjunction with the top striking plate, the inner sliding sleeve tube further configured to be received by and to slide up and down within the outer mounting tube;
the sensor coupled to the inner sliding sleeve tube such that when the inner sliding sleeve tube moves upwardly or downwardly with respect to the outer mounting tube, the sliding of the inner sliding sleeve tube with respect to the sensor causes the sensor to send electronic messages to a sound module to trigger production of sounds.

15. The assembly of claim 14, wherein the sensor is a variable resistor.

16. The assembly of claim 14, wherein the top striking plate is a metallic top cymbal.

17. The assembly of claim 14, wherein the outer mounting tube is rigidly affixed to a bottom metallic cymbal.

* * * * *